US010490762B2

United States Patent
Walter et al.

(10) Patent No.: US 10,490,762 B2
(45) Date of Patent: Nov. 26, 2019

(54) QUANTUM DOT LIGHT EMITTING DEVICES

(71) Applicant: University of North Carolina at Charlotte, Charlotte, NC (US)

(72) Inventors: Michael G. Walter, Charlotte, NC (US); Marcus Jones, Hunterville, NC (US); Edward Stokes, Charlotte, NC (US)

(73) Assignee: University of North Carolina at Charlotte, Charlotte, NC (US)

( * ) Notice: Subject to any disclaimer, the term of this patent is extended or adjusted under 35 U.S.C. 154(b) by 0 days.

(21) Appl. No.: 15/548,682

(22) PCT Filed: Feb. 4, 2016

(86) PCT No.: PCT/US2016/016547
§ 371 (c)(1),
(2) Date: Aug. 3, 2017

(87) PCT Pub. No.: WO2016/126928
PCT Pub. Date: Aug. 11, 2016

(65) Prior Publication Data
US 2018/0033988 A1     Feb. 1, 2018

Related U.S. Application Data

(60) Provisional application No. 62/111,892, filed on Feb. 4, 2015.

(51) Int. Cl.
*H01L 51/50* (2006.01)
*H01L 33/06* (2010.01)
(Continued)

(52) U.S. Cl.
CPC .......... *H01L 51/502* (2013.01); *H01L 33/002* (2013.01); *H01L 33/005* (2013.01);
(Continued)

(58) Field of Classification Search
None
See application file for complete search history.

(56) References Cited

U.S. PATENT DOCUMENTS

| 8,766,315 B2* | 7/2014 | Kang ..................... C08F 8/06 257/103 |
| 2005/0058415 A1 | 3/2005 | Lee et al. |
| 2008/0217602 A1 | 9/2008 | Kahen |

FOREIGN PATENT DOCUMENTS

| JP | 2009-099563 A | 5/2009 |
| KR | 10-2011-0018066 A | 2/2011 |
| KR | 10-2012-0067158 A | 6/2012 |

OTHER PUBLICATIONS

Yang et al, High density GaN/AlN quantum dots for deep UV LED with high quantum efficiency and temperature stability, Jun. 5, 2014, Scientific Reports, vol. 4, pp. 1-5.*
(Continued)

*Primary Examiner* — Fernando L Toledo
*Assistant Examiner* — Valerie N Newton
(74) *Attorney, Agent, or Firm* — J. Clinton Wimbish; Nexsen Pruet, PLLC

(57) ABSTRACT

In one aspect, light emitting devices are described herein. In some embodiments, a light emitting device described herein comprises an inorganic semiconductor substrate and a layer of quantum dots (QDs) covalently bonded to the inorganic semiconductor substrate. Such a device may further comprise an electrode and an overlayer positioned between the electrode and the layer of QDs. Moreover, the overlayer can be immediately adjacent to and in contact with the layer of QDs. Further, in some cases, the layer of QDs is a close-packed layer of QDs. Additionally, the light emitting device can be a green-emitting light emitting diode (LED) or an amber-emitting LED.

27 Claims, 1 Drawing Sheet

(51) Int. Cl.
*H01L 51/00* (2006.01)
*H01L 33/00* (2010.01)
*H01L 51/56* (2006.01)

(52) U.S. Cl.
CPC ............ *H01L 33/06* (2013.01); *H01L 51/004* (2013.01); *H01L 51/0037* (2013.01); *H01L 51/56* (2013.01); H01L 51/5056 (2013.01); H01L 51/5072 (2013.01)

(56) References Cited

OTHER PUBLICATIONS

International Search Report and Written Opinion, issued in corresponding International Application No. PCT/US2016/016547, dated Jul. 11, 2016, 7 pages.

\* cited by examiner

_US 10,490,762 B2_

QUANTUM DOT LIGHT EMITTING DEVICES

CROSS REFERENCE TO RELATED APPLICATIONS

This application is a U.S. National Phase of PCT/US2016/016547, filed Feb. 4, 2016, which claims priority pursuant to 35 U.S.C. § 119(e) to U.S. Provisional Patent Application Ser. No. 62/111,892, filed Feb. 4, 2015, each of which are hereby incorporated by reference in their entireties.

FIELD

This invention relates to electroluminescent devices and, in particular, to quantum dot-based light emitting diodes (QD-LEDs).

BACKGROUND

Currently available light emitting device or light emitting diode (LED) solid state lighting (SSL) products can provide light having a wide range of colors. For green or amber emission, currently available LED SSL products are largely enabled by blue InGaN LED light sources coupled to phosphor downconverters to provide a so called pc-LED structure. Some existing products also employ traditional Group III-V red emitters for fine color adjustment. Such products are becoming increasingly affordable and available and have resulted in significant energy savings in the general illumination sector. However, additional efficiency could be gained through the use of LEDs that provide green or amber emission directly, without the use of downconverters. Unfortunately, such green or amber LEDs remain largely unobtainable through conventional LED structures and methods of making LEDs.

Therefore, there exists a need for improved light emitting devices and methods of making light emitting devices that can provide superior performance and/or efficiency, including for green and amber emission.

SUMMARY

In one aspect, light emitting devices or light emitting diodes (LEDs) are described herein. In some embodiments, an LED described herein comprises an inorganic semiconductor substrate and a layer of quantum dots (QDs) covalently bonded to the inorganic semiconductor substrate. Further, in some cases, the QDs of a device described herein are covalently bonded to the inorganic semiconductor substrate through one or more linkers. More particularly, the linkers can have a first end covalently bonded directly to a surface of the inorganic semiconductor substrate and a second end bonded to a QD of the layer of QDs. In addition, in some instances, the one or more linkers comprise the reaction product of a click chemistry reaction.

Moreover, in some embodiments described herein, the layer of QDs is a close-packed layer of QDs. Additionally, the QDs can emit electromagnetic radiation having a peak emission between 525 nm and 535 nm (as may be desirable for a green-emitting LED) or between 580 nm and 590 nm (as may be desirable for an amber-emitting LED).

A device described herein may further comprise one or more electrodes or electrical contacts, and an overlayer deposited or positioned between an electrode and the layer of QDs. In some cases, the overlayer can be immediately adjacent to and in contact with the layer of QDs. In addition, the overlayer can be a charge-transport layer. Further, a first electrode can be in electrical communication with the overlayer and/or a second electrode can be in electrical communication with the inorganic semiconductor substrate. In such cases, the semiconductor substrate, the layer of QDs, and the overlayer can be positioned between the first electrode and the second electrode. Additionally, the inorganic semiconductor substrate and the overlayer can serve as sources of charge carriers for radiative recombination in the layer of QDs. For example, in some instances, the inorganic semiconductor substrate can be an n-type layer and the overlayer can be a p-type layer.

In another aspect, methods of making a light emitting device are described herein. In some embodiments, a method described herein comprises functionalizing a surface of an inorganic semiconductor substrate with a first chemical species comprising a first reactive moiety. In some cases, functionalizing the surface of the inorganic semiconductor substrate with the first chemical species can comprise covalently bonding the first chemical species to the surface of the semiconductor substrate. Additionally, the method further comprises providing a plurality of QDs, wherein the QDs are functionalized with a second chemical species comprising a second reactive moiety. Further, the method also comprises attaching the plurality of QDs to the surface of the inorganic semiconductor substrate by reacting the first reactive moiety with the second reactive moiety, thereby forming a covalent bond between the first chemical species and the second chemical species. Moreover, in some cases, forming a covalent bond between the first chemical species and the second chemical species forms a linker between the inorganic semiconductor surface and the plurality of QDs. Further, in some cases, the linker forms a non-Ohmic region between the surface of the inorganic semiconductor substrate and the plurality of QDs.

In addition, a method described herein can further comprise depositing an overlayer material over the plurality of QDs following attachment of the QDs to the surface of the inorganic semiconductor substrate. In some cases, the overlayer material is deposited directly onto the plurality of QDs. Moreover, in some embodiments, a method described herein further comprises reacting any unreacted first moieties with a spacer compound prior to depositing the overlayer material over the plurality of QDs. A method of making a light emitting device described herein can also comprise placing the overlayer material in electrical communication with a first electrode and/or placing the inorganic semiconductor substrate in electrical communication with a second electrode.

In another aspect, methods of generating light are described herein. In some embodiments, a method of generating light comprises providing a device described herein. For example, in some cases, the device comprises a first electrode or electrical contact, a second electrode or electrical contact, an inorganic semiconductor substrate, a layer of QDs covalently bonded to the inorganic semiconductor substrate, and an overlayer positioned between the first electrode and the layer of QDs. Additionally, the first electrode can be in electrical communication with the overlayer, and the second electrode can be in electrical communication with the inorganic semiconductor substrate. In some such instances, the semiconductor substrate, the layer of QDs, and the overlayer are all positioned between the first electrode and the second electrode. A method of generating light described herein can further comprise applying a voltage to the first electrode and the second electrode and radiatively recombining holes and electrons in the layer of QDs.

These and other embodiments are described in greater detail in the detailed description which follows.

DETAILED DESCRIPTION

Figure 1:
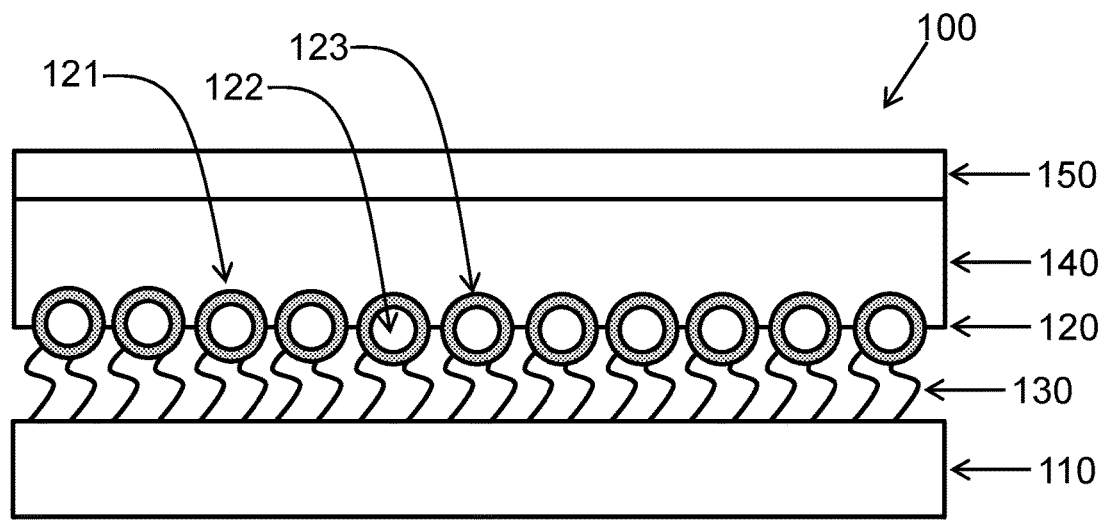
FIG. 1 illustrates a sectional view of a light emitting device according to one embodiment described herein.

Embodiments described herein can be understood more readily by reference to the following detailed description, examples and drawings and their previous and following descriptions. Elements, apparatus and methods described herein, however, are not limited to the specific embodiments presented in the detailed description, examples and drawings. It should be recognized that these embodiments are merely illustrative of the principles of the present invention. Numerous modifications and adaptations will be readily apparent to those of skill in the art without departing from the spirit and scope of the invention.

In addition, all ranges disclosed herein are to be understood to encompass any and all subranges subsumed therein. For example, a stated range of "1.0 to 10.0" should be considered to include any and all subranges beginning with a minimum value of 1.0 or more and ending with a maximum value of 10.0 or less, e.g., 1.0 to 5.3, or 4.7 to 10.0, or 3.6 to 7.9.

All ranges disclosed herein are also to be considered to include the end points of the range, unless expressly stated otherwise. For example, a range of "between 5 and 10" or "from 5 to 10" should generally be considered to include the end points 5 and 10.

Further, when the phrase "up to" is used in connection with an amount or quantity, it is to be understood that the amount is at least a detectable amount or quantity. For example, a material present in an amount "up to" a specified amount can be present from a detectable amount and up to and including the specified amount.

I. Light Emitting Devices

In one aspect, light emitting devices are described herein. In some embodiments, a light emitting device described herein comprises an inorganic semiconductor substrate and a layer of QDs covalently bonded to the inorganic semiconductor substrate. Additionally, in some cases, a light emitting device described herein further comprises an overlayer deposited over the layer of QDs. In such cases, the semiconductor substrate and the overlayer can serve as sources of charge carriers for recombination in the layer of QDs. Moreover, as described above, the overlayer can provide charge carriers of opposite charge compared to charge carriers provided by the semiconductor substrate. For example, in some instances, the semiconductor substrate can be an n-type layer and the overlayer can be a p-type layer.

A device described herein may also comprise a first electrode in electrical communication with the overlayer, a second electrode in electrical communication with the inorganic semiconductor substrate, or both. Moreover, in some instances, the inorganic semiconductor substrate, the layer of QDs, and the overlayer are positioned between the first electrode and the second electrode.

It is further to be understood that the energy bands, bandgap energies, and/or work function energies of the inorganic semiconductor substrate, the QDs, the overlayer, the first electrode, and the second electrode of a device described herein, relative to vacuum, can be selected to provide a desired flow of holes and electrons through the components of the device for radiative recombination in the layer of QDs. Additionally, as further described herein, the doping type or other electronic property of the inorganic semiconductor substrate, QDs, and overlayer can be selected to provide a desired flow of charge carriers within the device and/or to comport with a desired fabrication process for the device.

Thus, a device described herein can be an electroluminescent device capable of emitting light of various wavelengths. In some embodiments, for example, a device described herein is a green-emitting light emitting diode. In other cases, a device described herein is an amber-emitting light emitting diode.

Turning now to components of devices, light emitting devices described herein comprise an inorganic semiconductor substrate. Any inorganic semiconductor substrate not inconsistent with the objectives of the present invention may be used. In some embodiments, for example, an inorganic semiconductor substrate is formed from a wide-bandgap semiconductor, such as a semiconductor having a bandgap of greater than about 2 eV, greater than about 2.5 eV, or greater than about 3 eV. Moreover, in some instances, an inorganic semiconductor substrate is formed from a semiconductor having a bandgap between about 2 eV and 4 eV, between about 2 eV and 3.5 eV, between about 2 eV and 3 eV, between about 2.5 eV and 4 eV, or between about 2.5 eV and 3.5 eV. The bandgap energy of an inorganic semiconductor substrate described herein, in some cases, can be selected based on a desired wavelength of light to be emitted by an LED. For instance, in some embodiments, a bandgap of greater than or equal to about 2.12 eV is selected for an amber-emitted LED, or a bandgap of greater than or equal to about 2.34 eV is selected for a green-emitting LED. Inorganic semiconductor substrates having other bandgaps may also be used.

An inorganic semiconductor substrate of a device described herein can comprise, consist of, consist essentially of, or be formed from any inorganic semiconductor material not inconsistent with the objectives of the present invention. In some embodiments, the inorganic semiconductor substrate of a device described herein is formed from a Group IV semiconductor, a Group III-V semiconductor, or a Group II-VI semiconductor. Additionally, an inorganic semiconductor substrate may be formed from a binary, ternary, or quaternary semiconductor material. In some cases, the inorganic semiconductor substrate of a device described herein is formed from GaN. In other instances, the inorganic semiconductor substrate is formed from a semiconductor having the formula $Al_xIn_yGa_{(1-x-y)}N$, wherein x and y are not both equal to zero. An inorganic semiconductor substrate described herein may also be formed from a polymorph of SiC, such as 6H—SiC. Additionally, in some instances, an inorganic semiconductor substrate is formed from a material having the formula $Mg_xCd_yZn_{(1-x-y)}O$, wherein each of x and y can range from 0 to 1. Additionally, the inorganic semiconductor substrate of a device described herein can be doped. An inorganic semiconductor substrate may also be or define an n-type layer, a p-type layer, or an intrinsic semiconductor layer.

Further, an inorganic semiconductor substrate of a light emitting device described herein can have any thickness not inconsistent with the objectives of the present invention. In some embodiments, for instance, an inorganic semiconductor substrate has an average thickness between about 500 nm and about 1 cm. In some cases, an inorganic semiconductor substrate has an average thickness between about 1 μm and about 1 cm, between about 500 μm and about 1 cm, between about 500 μm and about 50 mm, or between about 500 μm and about 5 mm. Other thicknesses are also possible.

Light emitting devices described herein also comprise a layer of quantum dots covalently bonded to the inorganic semiconductor substrate. Any quantum dots not inconsistent with the objectives of the present invention may be used. Further, a "quantum dot," for reference purposes herein, comprises a semiconductor nanocrystal having a size in two or three dimensions that is sufficiently small to exhibit quantum confinement effects, particularly with respect to the bandgap energy of the quantum dot. Thus, a quantum dot can be a semiconductor nanocrystal having a length two or three dimensions that is no greater than about two times the exciton Bohr radius of the semiconductor material forming the quantum dot. In some cases, a quantum dot described herein has a length in two or three dimensions of about 1-50 nm, 1-30 nm, 1-20 nm, or 1-15 nm.

Quantum dots described herein may also be substantially monodisperse or have a narrow size distribution. For example, in some cases, the size distribution of a population of QDs described herein has a standard deviation of less than about 15%, less than about 10%, or less than about 8%. In some instances, the standard deviation is about 5-15%, 5-10%, or 8-15%.

Additionally, in some embodiments, the QDs of a layer of QDs described herein are colloidal QDs. Such "colloidal" QDs can be formed through a solution-based nucleation and growth mechanism, rather than through a molecular beam nucleation and growth mechanism, such as a molecular beam epitaxy (MBE) mechanism. Moreover, a "colloidal" QD can include a "ligand" shell comprising a plurality of "ligands," "caps," or "capping molecules" attached to at least a portion of the exterior surface of the QD. Such ligands or caps can provide steric and/or thermodynamic hindrance to the coalescence or fusing of individual QDs, and may also permit the QDs to be dispersed or dissolved in a solvent. Additionally, the ligands or caps of a QD may be attached or bonded to the exterior surface of the QD through a covalent or non-covalent bond. For example, in some cases, ligands are bonded to the exterior surface of the QD through one or more dative bonds. Non-limiting examples of ligands that may form a ligand shell of a colloidal QD described herein include phosphines, phosphine oxides, amines, thiols, carboxylates, and carboxylic acids. Further, such ligands can be monodentate or multidentate, and monomeric or dendrimeric. Ligands of a colloidal QD may also include 4 to 50, 4 to 30, or 4 to 20 carbon atoms, including as part of one or more aliphatic "tails" or chains, such as included in a trioctylphosphine ligand.

In some cases, QDs described herein are formed from a Group II-VI semiconductor material such as ZnS, ZnSe, ZnTe, CdS, CdSe, CdTe, HgS, HgSe, or HgTe. Additionally, QDs described herein, in some embodiments, can be formed from a mixture, blend, or alloy of one or more of the foregoing Group II-VI semiconductor materials, such as $Cd_xZn_{(1-x)}S$. In other instances, QDs described herein are formed from a Group III-V semiconductor material such as GaN, GaP, GaAs, GaSb, InP, InAs, or InSb, or from a mixture, blend, or alloy of one or more of the foregoing Group III-V semiconductor materials, such as $InP_xAs_{(1-x)}$.

Moreover, in some embodiments, a QD described hereinabove further includes a dopant. Further, such a dopant can be an emissive dopant. For example, in some instances, a QD described herein is formed from a Group II-VI semiconductor material or a Group III-V semiconductor material doped with one or more of Mn, Fe, Co, Ni, Pd, Pt, Cu, Al, Ag, Au, and a rare earth metal.

Additionally, in some cases, QDs described herein comprise core/shell QDs. As understood by one of ordinary skill in the art, "core/shell" QDs comprise a "core" formed from a first semiconductor material overcoated or surrounded by a "shell" formed from a second semiconductor material. The first and second semiconductor materials can be different materials. In some cases, the second semiconductor material has a higher bandgap than the first semiconductor material and the band energies of the first semiconductor material lie within the band energies of the second semiconductor material. In such a "Type I" configuration, quantum confinement of the exciton can take place primarily within the core. Core/shell QDs may also have a "Type II" configuration in which the bands of the core and shell are "offset" such that one type of carrier (e.g., the electron) may be primarily confined to one portion of the QD (e.g., either the core or the shell), and the other type of carrier (e.g., the hole) may be primarily confined to another portion of the QD (e.g., the shell or the core), such that the Type II QD exhibits an effective bandgap smaller than the bandgap of either the core or the shell. A QD described herein may also have more than one shell. For example, in some cases, a QD described herein is a core/shell/shell QD. Other configurations are also possible, and devices described herein are not particularly limited to a specific QD structure. Some non-limiting examples of core/shell QDs that may be suitable for use in some embodiments described herein include CdS/ZnS, CdS/ZnSe, CdS/ZnTe, CdSe/ZnS, CdSe/ZnSe, CdSe/ZnSe, CdSe/CdS, InAs/InP, and InAs/ZnSe.

Further, the semiconductor material or materials and/or the structure of a QD described herein may be selected to provide a desired photoluminescent emission profile. For example, in some cases, the QDs of a device described herein emit electromagnetic radiation centered in, or having a peak or average emission in, the visible region of the electromagnetic spectrum. In some such cases, the QDs emit electromagnetic radiation having a peak or average emission between about 350 nm and 650 nm, between about 400 nm and 620 nm, between about 450 nm and 650 nm, between about 450 nm and 600 nm, between about 500 nm and 650 nm, between about 500 nm and 620 nm, between about 500 nm and 600 nm, between about 520 nm and 600 nm, between about 525 nm and 535 nm, between about 550 nm and 600 nm, between about 570 nm and 600 nm, or between about 580 nm and 590 nm. Alternatively, in other instances, QDs described herein emit electromagnetic radiation having a peak or average emission in the near infrared (NIR, 750 nm-1.4 μm) or ultraviolet A (UVA, 315-400 nm) portion of the electromagnetic spectrum.

Moreover, QDs described herein can have a high internal photoluminescent quantum yield (QY). In some embodiments, QDs described herein have an internal photoluminescent QY of up to 70%, up to 60%, up to 50%, up to 40%, or up to 30%. In some instances, QDs described herein have an internal photoluminescent QY of 10-70%, 10-60%, 10-40%, 15-70%, 15-60%, 15-50%, 15-40%, 20-70%, 20-50%, 20-40%, 30-70%, or 30-50%.

Additionally, in some embodiments, a layer of QDs described herein is a close-packed layer of QDs. A "close-packed" layer of QDs, as used herein, is a layer of QDs having an areal density of QDs that is within about 15%, within about 10%, or within about 5% of the theoretical maximum areal density of the QDs, wherein the percentage is based on the theoretical maximum areal density as the denominator. Further, in some cases, a close-packed layer of QDs is also a continuous layer, such that the entire layer or substantially the entire layer of QDs is close-packed, with no or substantially no "gaps" or vacancies in QD density or coverage. In other cases, a close-packed layer of QDs may not be a continuous layer. Such a layer of QDs, in some instances, can include one or more regions in which QDs are "missing" from the close-packed arrangement. In some embodiments described herein, the layer of QDs is at least 60%, at least 70%, at least 80%, at least 85%, at least 90%, at least 95%, at least 98%, or at least 99% close-packed, wherein the percentage is based on the total planar area of the layer of QDs as the denominator.

Further, a "layer" of QDs described herein (whether close-packed or not) may be a monolayer of QDs. It is also possible for a "layer" of QDs to include several monolayers of QDs in a stacked configuration. For example, in some cases, a "layer" of QDs comprises up to 10 monolayers, up to 5 monolayers, or up to 3 monolayers of QDs, wherein the monolayers are in direct contact with one another in a stacked configuration. In some embodiments, a layer of QDs described herein has a thickness of up to about 100 nm, up to about 70 nm, up to about 50 nm, up to about 30 nm, or up to about 20 nm. In some instances, a layer of QDs has a thickness of about 5 nm to 100 nm, 5 nm to 70 nm, 5 nm to 50 nm, 5 nm to 30 nm, 10 nm to 100 nm, 10 nm to 70 nm, 10 nm to 50 nm, or 10 nm to 30 nm.

As described hereinabove, the layer of QDs is covalently bonded to the inorganic semiconductor substrate of the device. It is to be understood that QDs "covalently bonded" to the inorganic semiconductor substrate can be bonded to the substrate through a ligand, capping molecule, or other linker between one or more individual QDs and a surface of the inorganic semiconductor substrate, as opposed to being bonded to the inorganic semiconductor substrate surface through a covalent bond between the inorganic semiconductor substrate surface and the inorganic core or shell of the QD directly. Moreover, such a linker can have a first end and a second end, wherein the first end is covalently bonded directly to the surface of the inorganic semiconductor substrate, and the second end is bonded to a surface of a QD. The second end can be bonded to the surface of the QD through any type of bond not inconsistent with the objectives of the present disclosure. For instance, in some cases, the second end is bonded to the surface of the QD through one or more dative or labile bonds. As understood by one of ordinary skill in the art, such dative or labile bonds can have a bond strength or bonding energy that permits the second end of the linker or ligand to "come on and off" the QD surface under certain conditions, such as conditions including a temperature of 25-100° C. For example, in some cases, a dative or labile bond between a linker and a QD can have a bonding energy of less than about 50 kJ/mol, less than about 20 kJ/mol, or less than about 10 kJ/mol. A dative or labile bond may also have a bonding energy of about 5 kJ/mol to 50 kJ/mol or about 10 kJ/mol to 40 kJ/mol. It is also possible for the second end of a linker to be bonded to a surface of a QD through one or more covalent bonds, or through one or more bonds having a bond strength or bonding energy similar to a covalent bond. For instance, in some embodiments, a bond between a linker and a QD can have a bonding energy of greater than about 100 kJ/mol, greater than about 200 kJ/mol, or greater than about 300 kJ/mol. In some cases, a bond between a linker and a QD has bonding energy of about 100 kJ/mol to 400 kJ/mol, about 100 kJ/mol to 300 kJ/mol, or about 100 kJ/mol to 200 kJ/mol.

Moreover, in some cases, the linker or ligand of a QD further serves as a spacer between the surface of the inorganic semiconductor substrate and the layer of QDs. In some such instances, the spacer can be a non-Ohmic spacer. Further, in some embodiments, the linker separates the surface of the inorganic semiconductor substrate from the layer of QDs by 0.5 nm to 10 nm, 0.5 nm to 5 nm, 1 nm to 10 nm, 1 nm to 3 nm, 2 nm to 10 nm, or 2 nm to 5 nm, based on the average shortest distance between the surface of the semiconductor substrate and the layer of QDs. Additionally, the linker of a device described herein can be conjugated or non-conjugated. Further, a conjugated linker can comprise one or more conjugated moieties. A linker described herein may also have an occupied electronic π-system that is not necessarily a conjugated system. Not intending to be bound by theory, it is believed that the presence of one or more conjugated moieties and/or some other occupied electronic π-system may assist with the transfer of charge from the inorganic semiconductor substrate to the QDs for radiative recombination. More generally, again not intending to be bound by theory, it is believed that a linker described hereinabove can provide an advantageous balance between (1) electrical insulation of the layer of QDs (e.g., through a sufficiently large separation distance provided by a sufficiently poor electrical conductor) and (2) ability of injected charge carriers to access the layer of QDs (e.g., through tunneling or "hopping" of carriers across a sufficiently small separation distance and/or through a sufficiently accessible π-system).

Moreover, in some cases, a linker described herein can have a length of 0.5 nm to 10 nm, 0.5 nm to 5 nm, 0.5 nm to 2 nm, 1 nm to 10 nm, 1 nm to 3 nm, 2 nm to 10 nm, or 2 nm to 5 nm (where the length is along the linker's longest dimension or along a dimension corresponding to the "linking" direction or the shortest distance between the inorganic semiconductor substrate and the layer of QDs linked by the linker). Again not intending to be bound by theory, it is believed that a linker having such a length can provide a non-Ohmic region between the inorganic semiconductor substrate and the layer of QDs, or otherwise permit or facilitate sufficient charge transfer between the inorganic semiconductor substrate and the layer of QDs to enable recombination of carriers in the layer of QDs at a rate suitable for a light emitting device such as a light emitting diode.

In addition, as described further hereinbelow in Section II, the linker of a layer of QDs can be formed through the reaction of a ligand or capping molecule of a QD with a chemical species present on the surface of the inorganic semiconductor substrate. Moreover, the ligand or capping molecule can be reacted with the chemical species present on the surface of the inorganic semiconductor substrate in any manner not inconsistent with the objectives of the present invention. For example, in some embodiments, one or more linkers comprise the reaction product of a click chemistry reaction. Any click chemistry reaction not inconsistent with the objectives of the present invention may be used. For instance, such a click chemistry reaction can be a thermal click chemistry reaction or another type of click chemistry reaction, such as a strain promoted alkyne-azide cycloaddition (SPAAC) or a copper-catalyzed alkyne-azide cycloaddition (CuAAC). Thus, in some embodiments, a linker described herein comprises or includes a 1,4- or 1,5-triazole ring. In other cases, the click chemistry reaction comprises a strain-promoted alkyne-nitrone cycloaddition (SPANC) reaction, a thiol-ene reaction, a Diels-Alder reaction, an inverse electron demand Diels-Alder (IEDDA)

reaction, or an isonitrile-tetrazine cycloaddition reaction. In some such instances, a linker described herein can comprise or include an N-alkylated isoxazoline or a hydrothiolation reaction product such as an alkyl sulfide.

Light emitting devices described herein also comprise an overlayer deposited, disposed, or positioned over the layer of QDs. As described above, the overlayer can serve as a source of charge carriers for injection into the layer of QDs for radiative recombination. In some cases, the overlayer is a p-type layer. Alternatively, in other instances, the overlayer is an n-type layer. Thus, in some cases, the overlayer is formed from a hole-transport material or an electron-transport material.

More generally, the overlayer can be formed from any material not inconsistent with the objectives of the present invention. In some embodiments, the overlayer is formed from a polymeric material such as poly(3,4-ethylenedioxythiophene):polystyrene sulfonate (PEDOT:PSS), oxidatively doped polyaniline (PAni), oxidatively doped polypyrrole (Pyr), oxidatively doped polythiophene (PT), 2,2',7,7'-Tetrakis-(N,N-di-4-methoxyphenylamino)-9,9'-spirobifluorene (spiro-OMETAD), polytriarylamine, poly(2-vinylnapthalene), poly(9-vinylcarbazole), poly(2-vinylcarbazole), or a combination thereof. In some instances, the overlayer is formed from a metal-containing material such as a metal oxide material. Such metal-containing materials may include $MoO_3$, NiO, copper (I) thiocyanate, copper (I) iodide, indium tin oxide (ITO), or a combination thereof. An overlayer may also be formed from a semiconductor material, including a semiconductor material described hereinabove for the inorganic semiconductor substrate of the device, such as GaN. In some instances, the overlayer may be formed from the same semiconductor material as the inorganic semiconductor substrate of the device. Alternatively, in other cases, the overlayer may be formed from a semiconductor material differing from the semiconductor material of the inorganic semiconductor substrate of the device.

Light emitting devices described herein also comprise one or more electrodes or electrical contacts. For instance, in some cases, a device comprises a first electrode in electrical communication with the overlayer and/or a second electrode in electrical communication with the inorganic semiconductor substrate. Such electrodes or electrical contacts can serve as the cathode and anode for injection of charge carriers into the inorganic semiconductor substrate, overlayer, and/or layer of QDs for radiative recombination of the charge carriers within the layer of QDs. Additionally, as described further herein, the first electrode and the second electrode can be disposed on opposite sides (physically or electrically) of the inorganic semiconductor substrate, the layer of QDs, and the overlayer. For example, in some embodiments, the first and second electrodes are in facing opposition to one another, such that the electrodes are parallel or substantially parallel to one another in a lateral plane, such as an xy-plane. The first and second electrodes may also be laterally aligned or laterally offset from one another in the x-direction and/or y-direction, as illustrated, for instance, in FIG. 1 of Pagan et al., "Colloidal quantum dot active layers for light emitting diodes," *Solid-State Electronics* 50 (2006), 1461-1465. In general, any structure or configuration of electrodes or electrical contacts not inconsistent with the objectives of the present invention may be used. Further, in some cases, the inorganic semiconductor substrate itself, or a portion thereof, and/or the overlayer itself, or a portion thereof, may serve as an electrode or electrical contact.

Moreover, the electrodes or electrical contacts of a device described herein can be formed from any material and have any physical dimensions not inconsistent with the objectives of the present invention. In some embodiments, for instance, electrodes or electrical contacts are formed from a highly conductive material such as a metal or metal alloy or mixture of metals. For example, in some cases, electrodes or electrical contacts are formed from chromium, nickel, gold, silver, copper, aluminum, indium, titanium, or a layered combination or alloy thereof. In some instances, electrodes or electrical contacts are formed from a conductive oxide such as a transparent conductive oxide (TCO). Non-limiting examples of transparent conductive oxides suitable for use in some embodiments described herein include indium tin oxide (ITO), gallium indium tin oxide (GITO), and zinc indium tin oxide (ZITO). Further, in some cases, electrodes or electrical contacts described herein have an average thickness between about 10 nm and about 1 mm, between about 50 nm and about 1 μm, or between about 50 nm and about 500 nm.

It is to be understood that light emitting devices described herein can have any combination of components, properties, and features described herein not inconsistent with the objectives of the present invention. For example, a light emitting device described herein can include any inorganic semiconductor substrate described herein in combination with any layer of QDs and/or overlayer described herein.

An exemplary embodiment of a light emitting device will now be further described with reference to the drawings. FIG. 1 illustrates a cross-sectional view of a light emitting device according to one embodiment described herein. Device (100) comprises an inorganic semiconductor substrate (110) formed of a wide bandgap semiconductor such as GaN. The device (100) further comprises a layer (120) of QDs (121). As illustrated in FIG. 1, the individual QDs (121) are core/shell QDs comprising a core (122) and a shell (123) surrounding the core (122). However, other QDs could also be used. Additionally, individual QDs (121) in the layer of QDs (120) are covalently bonded to the inorganic semiconductor substrate (110) by a linker (130). As described hereinabove, the linker (130) can be formed by a reaction between ligands (not shown) of a QD (121) and a chemical species (not shown) attached to the inorganic semiconductor substrate (110).

The device (100) further comprises an overlayer (140) disposed over the layer of QDs (120). In the embodiment of FIG. 1, the overlayer (140) is disposed directly on the layer of QDs (120) and is immediately adjacent to the layer of QDs (120). An electrode or electrical contact (150) is also disposed in electrical communication with the overlayer (140). As described hereinabove, an additional electrode (not shown) may also be disposed in electrical communication with the inorganic semiconductor substrate layer (110), including in a manner described hereinabove.

II. Methods of Making a Light Emitting Device

In another aspect, methods of making a light emitting device are described herein. In some embodiments, a method of making a light emitting device comprises functionalizing a surface of an inorganic semiconductor substrate with a first chemical species comprising a first reactive moiety. The method also comprises providing a plurality of QDs, wherein the QDs are functionalized with a second chemical species comprising a second reactive moiety. Additionally, a method described herein further comprises attaching the plurality of QDs to the surface of the inorganic semiconductor substrate by reacting the first reactive moiety with the second reactive moiety. In this manner, a covalent bond can be formed between the first chemical species and the second chemical species. Moreover, in some cases, a method described herein further comprises depositing an overlayer material over the plurality of QDs. Additionally, in some embodiments, a method described herein also comprises reacting any unreacted first reactive moieties with a spacer compound prior to depositing the overlayer material over the plurality of QDs. Moreover, in some instances, a method described herein further comprises placing the overlayer material in electrical communication with a first electrode and/or placing the inorganic semiconductor substrate in electrical communication with a second electrode.

Turning now to steps of methods, methods of making a light emitting device described herein comprise functionalizing a surface of an inorganic semiconductor substrate with a first chemical species comprising a first reactive moiety. The surface of the inorganic semiconductor substrate can be any surface of the inorganic semiconductor substrate not inconsistent with the objectives of the present invention. In some cases, for instance, the surface is an exterior surface. Further, the surface of the inorganic semiconductor substrate can be functionalized with a first chemical species in any manner not inconsistent with the objectives of the present invention. In some embodiments, functionalizing the surface comprises covalently bonding the first chemical species to the surface. Moreover, in some instances, functionalizing the surface of the inorganic semiconductor substrate with the first chemical species comprises alkylating the surface of the inorganic semiconductor substrate. "Alkylating" a surface of an inorganic semiconductor substrate can include forming a covalent bond between an organic compound, such as an aliphatic organic compound, and the inorganic semiconductor material of the inorganic semiconductor substrate. More particularly, alkylating a semiconductor surface can comprise forming a covalent bond between the inorganic semiconductor surface and a carbon atom of the organic compound. Further, the organic compound can include an alkyl, alkenyl, or alkynyl moiety. Alkylating a surface of an inorganic semiconductor substrate may be carried out in any number of steps and using any reagents not inconsistent with the objectives of the present invention. For instance, as described further hereinbelow, a surface of an inorganic semiconductor substrate can be alkylated by first chlorinating the surface and then carrying out a Grignard reaction on the surface. Other methods may also be used to alkylate or otherwise functionalize a surface of an inorganic semiconductor described herein.

Methods of making a light emitting device described herein also comprise providing a plurality of QDs, wherein the QDs are functionalized with a second chemical species comprising a second reactive moiety. Any QDs not inconsistent with the objectives of the present invention may be used. In some cases, the QDs comprise QDs described hereinabove in Section I. For example, in some instances, the QDs comprise QDs that emit electromagnetic radiation having a peak emission between 525 nm and 535 nm, or between 580 nm and 590 nm. Further, the QDs can be functionalized with the second chemical species in any manner not inconsistent with the objectives of the present invention. In some cases, the second chemical species comprises a ligand or capping molecule of the QDs, and the QDs are functionalized with the second chemical species by the attachment of the ligand or capping molecule to the QDs, including in a manner described hereinabove in Section I or hereinbelow in Example 1.

Moreover, the first reactive moiety of the first chemical species attached to the surface of the inorganic semiconductor substrate and the second reactive moiety of the second chemical species attached to the plurality of QDs can comprise any reactive moieties not inconsistent with the objectives of the present invention. In some cases, for example, the first reactive moiety comprises a first clickable moiety and the second reactive moiety comprises a second clickable moiety. A "clickable moiety," as used herein, refers to a moiety that can participate in a click chemistry reaction, such as a click chemistry reaction described hereinabove in Section I. The first and second clickable moieties can comprise any "paired" clickable moieties (i.e., clickable moieties that can react with one another in a click chemistry reaction) not inconsistent with the objectives of the present invention, including a pair of clickable moieties described hereinabove in Section I. For example, in some cases, the first reactive moiety comprises an alkyne moiety and the second reactive moiety comprises an azide moiety. Other pairs of clickable moieties may also be used. Thus, in some embodiments, the covalent bond between the first chemical species and the second chemical species is part of a click chemistry reaction product, such as a 1,5-triazole ring, an N-alkylated isoxazoline, or an alkyl sulfide.

It is not necessary in all instances for the reaction of a first reactive moiety and a second reactive moiety to be a click chemistry reaction. Other reactions may also be used. Moreover, in some cases, forming a covalent bond between the first chemical species and the second chemical species forms a linker between the semiconductor surface and the plurality of QDs. Such a linker can be or can have the structure of any linker described hereinabove in Section I. For example, in some instances, the linker further serves as a spacer or forms a spacing region between the surface of the inorganic semiconductor substrate and the QDs. Moreover, in some such instances, the spacer or spacing region can be a non-Ohmic spacer or region. Further, in some embodiments, the linker separates the surface of the inorganic semiconductor substrate from the quantum dots by 0.5 nm to 10 nm, 0.5 nm to 5 nm, 1 nm to 10 nm, 1 nm to 3 nm, 2 nm to 10 nm, or 2 nm to 5 nm, based on the average shortest distance between the surface of the semiconductor substrate and the quantum dots. Additionally, the linker of a method described herein can be conjugated or non-conjugated. Further, a conjugated linker can comprise one or more conjugated moieties. A linker described herein may also have an occupied electronic it-system that is not necessarily a conjugated system. Not intending to be bound by theory, it is believed that the presence of one or more conjugated moieties and/or some other occupied electronic π-system may assist with the transfer of charge from the inorganic semiconductor substrate to the QDs for radiative recombination.

Methods described herein can also comprise depositing an overlayer material over the plurality of QDs. In some cases, the overlayer material is a charge-transport material (such as a hole-transport material or an electron-transport material), and the overlayer material is deposited directly onto the plurality of QDs. It is to be understood that depositing an overlayer material "directly" onto the plurality of QDs can include depositing the overlayer material directly onto a layer formed by the QDs, wherein the "layer" can include the inorganic portion of the QDs as well as any ligand shell that may be present on a QD.

Further, any overlayer material not inconsistent with the objectives of the present invention may be used. In some cases, the overlayer material is a material for an overlayer described hereinabove in Section I. For example, in some instances, the overlayer material comprises a polymeric material such as poly(3,4-ethylenedioxythiophene):polystyrene sulfonate (PEDOT:PSS), oxidatively doped polyaniline (PAni), oxidatively doped polypyrrole (Pyr), oxidatively doped polythiophene (PT), 2,2',7,7'-Tetrakis-(N,N-di-4-methoxyphenylamino)-9,9'-spirobifluorene (spiro-OMETAD), polytriarylamine, poly(2-vinylnapthalene), poly(9-vinylcarbazole), poly(2-vinylcarbazole), or a combination thereof. Such an overlayer material may be deposited using standard polymer deposition techniques, such as solution casting. The overlayer material may also comprise a metal-containing material such as $MoO_3$, NiO, copper (I) thiocyanate, copper (I) iodide, indium tin oxide (ITO), or a combination thereof. Such an overlayer material may be deposited using standard metal deposition techniques, such as low temperature sputtering.

Additionally, as described further hereinabove, the overlayer material of a method described herein can form a charge-transport layer disposed or positioned between an electrode and a layer of QDs. Moreover, such an overlayer can provide charge carriers of a type opposite to that provided by the inorganic semiconductor substrate. For instance, in some embodiments, the inorganic semiconductor substrate forms or defines an n-type layer and the overlayer material forms or defines a p-type layer.

Methods described herein, in some cases, also comprise placing the overlayer material in electrical communication with a first electrode (or first electrical contact) and/or placing the inorganic semiconductor substrate in electrical communication with a second electrode (or second electrical contact). Moreover, the inorganic semiconductor substrate, the plurality of QDs, and the overlayer material can be disposed between the first and second electrodes. Further, the first and second electrodes can have any spatial arrangement, size, shape, and or structure not inconsistent with the objectives of the present invention. Additionally, the first and second electrodes can be formed from any material not inconsistent with the objectives of the present invention. In some cases, the first electrode and/or the second electrode has a structure or feature of an electrode described hereinabove in Section I.

Methods described herein, in some embodiments, also comprises reacting any unreacted first reactive moieties with a spacer compound prior to depositing the overlayer material over the plurality of QDs, where "unreacted" first reactive moieties refer to first reactive moieties remaining in their original form even after exposure to the second reactive moieties of the plurality of QDs. Reacting such unreacted first reactive moieties with a spacer compound can "passivate" the surface of the inorganic semiconductor substrate and/or provide a spacing region between the surface of the inorganic semiconductor substrate and a layer formed by the plurality of QDs, or between the surface of the inorganic semiconductor substrate and an overlayer disposed over the plurality of QDs. The spacer compound can have any size or length not inconsistent with the objectives of the present invention. In some embodiments, the spacer compound has a length greater than or equal to the average diameter of the plurality of quantum dots. In this manner, the spacer compound can prevent or inhibit direct physical or electrical contact between the overlayer material and the inorganic semiconductor substrate in the event the plurality of QDs does not provide a complete or unbroken layer between the inorganic semiconductor substrate and the overlayer material. In some cases, a spacer compound described herein has a length (such as along the longest dimension of the compound) of about 1 nm to 20 nm, about 1 nm to 15 nm, about 1 nm to 10 nm, about 5 nm to 20 nm, about 5 nm to 15 nm, or about 5 nm to 10 nm.

Any spacer compound not inconsistent with the objectives of the present invention may be used in a method described herein. In some cases, a spacer compound has a first end and second end, wherein the first end comprises a reactive moiety that can form a bond (such as a covalent bond) with a reactive moiety of the first chemical species on the surface of the inorganic semiconductor substrate, or directly with the surface of the inorganic semiconductor substrate. Thus, in some embodiments, the spacer compound comprises a reactive moiety that is the same as the second reactive moiety of the plurality of QDs. Moreover, the second end of the spacer compound can be an inert end or can include a relatively inert moiety, such as an alkyl, alkenyl, or aryl moiety. In such instances, the second end of the spacer compound can extend toward the plurality of QDs and/or toward the overlayer material of the device. Non-limiting examples of spacer compounds suitable for use in some embodiments described herein include a C1-C50 aliphatic compound such as a hydrocarbon, a C1-C50 aliphatic alcohol, and a C2-C50 aliphatic azide, where a "C2-C50" aliphatic species is to be understood to include 2 to 50 carbon atoms.

It is to be understood that various steps of methods of making a light emitting device described herein can be combined in any manner not inconsistent with the objectives of the present invention.

Figure 2:
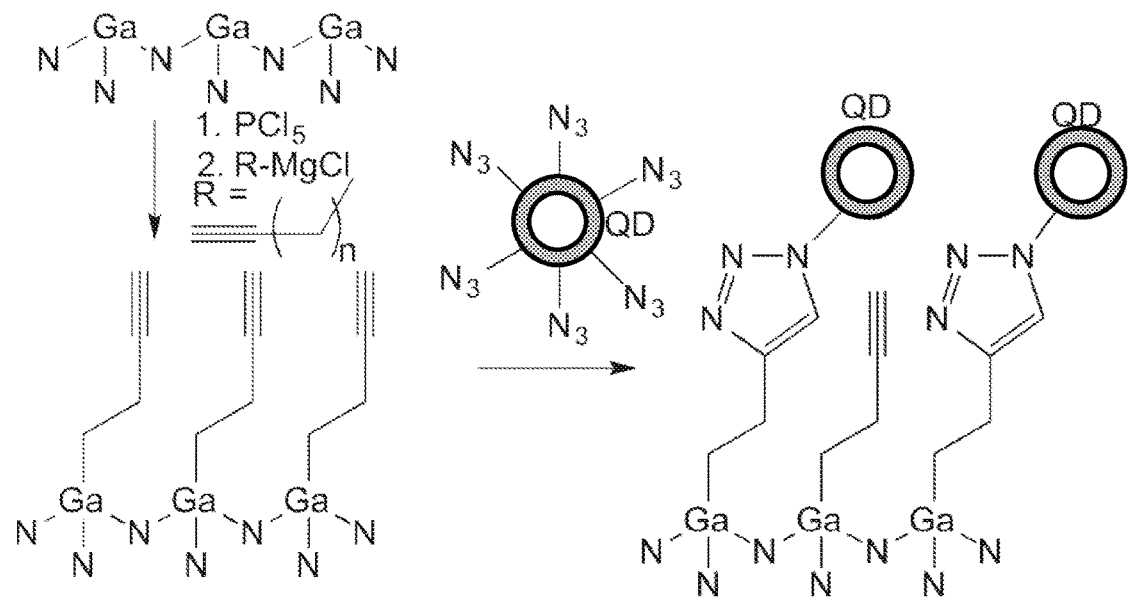
FIG. 2 illustrates steps of a method of making a light emitting device according to one embodiment described herein.

An exemplary embodiment of a method of making a light emitting device will now be further described with reference to the drawings. FIG. 2 illustrates three steps of a method described herein. In a first step, a GaN semiconductor substrate surface is functionalized with a first chemical species (a hydrocarbon) having a first reactive moiety (an alkyne moiety). Specifically, the GaN surface is chlorinated using phosphorus pentachloride ($PCl_5$), followed by alkylation of the surface using a Grignard reagent (RMgCl, where R comprises a hydrocarbon including a terminal alkyne moiety). The foregoing functionalization forms a covalent bond between the GaN surface and the hydrocarbon, with the result that the terminal alkyne moiety is presented to the external environment above the GaN surface. In a second step, a plurality of QDs (labeled as "QD" in FIG. 2) is provided. The QDs are functionalized with a second chemical species (not specifically shown) comprising a second reactive moiety (an azide moiety). Next, in a third step, alkyne moieties on the surface of the GaN substrate are reacted with azide moieties of the QDs in a copper-catalyzed alkyne-azide click chemistry reaction. In this manner, a covalent bond is formed between the first and second chemical species, and the QDs are covalently attached to the inorganic semiconductor surface. As illustrated in FIG. 2, the covalent bond between the first chemical species and the second chemical species described above is part of the triazole ring product of the alkyne-azide cycloaddition reaction. Moreover, as illustrated in FIG. 2, one alkyne moiety attached to the GaN surface has not reacted with an azide-functionalized QD. Such an unreacted moiety, if desired, can be reacted with a spacing compound in a manner described hereinabove prior to carrying out further steps of the method, such as forming an overlayer of the device.

III. Methods of Generating Light

In another aspect, methods of generating light are described herein. In some embodiments, a method of generating light comprises providing a light emitting device described herein. Any light emitting device described hereinabove in Section I may be used. For example, in some instances, a method of generating light described herein comprises providing a device comprising a first electrode or electrical contact, a second electrode or electrical contact, an inorganic semiconductor substrate, a layer of QDs covalently bonded to the inorganic semiconductor substrate, and an overlayer positioned between the electrode or electrical contact and the layer of QDs, wherein the first electrode or electrical contact is in electrical communication with the overlayer and the second electrode or electrical contact is in electrical communication with the inorganic semiconductor substrate. Such a method can further comprise applying a voltage bias between the first and second electrodes and consequently radiatively recombining holes and electrons in the layer of QDs. Any voltage not inconsistent with the objectives of the present invention may be used. Moreover, as described hereinabove, the radiative recombination of holes and electrons in the layer of QDs can provide a device that is a green-emitting light emitting or diode an amber-emitting light emitting diode. Other emission wavelengths are also possible.

Additional embodiments will now be further described with reference to the following non-limiting examples.

Example 1

Azide-Functionalized CdSe/CdS Core/Shell Quantum Dots

Azide-functionalized QDs suitable for use in some embodiments of devices and methods described herein can be prepared in a variety of ways, including the following. Although the following protocols describe the formation of azide-functionalized CdSe/CdS QDs, it is to be understood that other QDs functionalized with other reactive moieties may be formed in analogous ways, as appreciated by those of ordinary skill in the art. Additional detail may be found in M. Green, "The nature of quantum dot capping ligands," *J. Mater. Chem.*, 2010, 20, 5797-5809.

A. Ligand Exchange with Azide-Containing Thiols

Colloidal CdSe/CdS QDs stabilized with trioctylphosphine oxide (TOPO) ligands are first washed with ethanol and/or precipitated by one or more precipitation/redispersion cycles using a solvent (such as THF or hexane) and a miscible non-solvent (such as chloroform or ethanol). The QDs are then redispersed in a solution of an azide-containing thiol such as 11-azido-1-undecanethiol. Not intending to be bound by theory, it is believed that the thiol moiety of this ligand at least partially replaces, displaces, or exchanges for the oxide moiety of the original TOPO ligands. As a result, colloidal QDs are provided in which at least a portion of the ligand shell is formed from the azide-containing thiol, wherein the thiol moiety is bonded to the QD surface (e.g., through dative bonds) and the azide moiety is presented to the surrounding solution or solvent.

B. Ligand Exchange with Azide-Containing Siloxanes

Colloidal CdSe/CdS QDs stabilized with a surfactant such as TOPO or trioctylphosphine (TOP) are first dispersed in toluene to provide a QD solution. Next, acetic acid, water, and (3-azopropyl)trimethoxysilane ($(MeO)_3SiCH_2CH_2CH_2N_3$) are added to the QD solution. The mixture is then stirred overnight at 105° C. to carry out a ligand exchange reaction. Again not intending to be bound by theory, it is believed that the siloxane moiety of the trimethoxysilane ligand at least partially replaces, displaces, or exchanges for the original surfactant ligands of the QD through the a condensation reaction in which MeOH is lost and SiO-QD bonds are formed. As a result, colloidal QDs are provided in which at least a portion of the ligand shell is formed from the azide-containing siloxane, wherein the siloxane moiety is bonded to the QD surface and the azide moiety at the opposite terminus of the ligand is presented to the surrounding solution or solvent.

Example 2

Alkyne-Functionalized n-Doped GaN

An alkyne-functionalized GaN substrate suitable for use in some embodiments of devices and methods described herein can be prepared in a variety of ways, including the following. Although the following protocol describes the formation of a surface of n-doped GaN functionalized with alkyne moieties, it is to be understood that other inorganic semiconductor surfaces may be functionalized with other reactive moieties in analogous ways. In particular, it is to be understood that other inorganic semiconductors having the formula $Al_xIn_yGa_{(1-x-y)}N$ may be functionalized in an analogous manner as described below. Additional detail regarding the alkylation of GaN surfaces may be found in S. L. Peczonczyk et al., "Wet Chemical Functionalization of III-V Semiconductor Surfaces: Alkylation of Gallium Arsenide and Gallium Nitride by a Grignard Reaction Sequence," *Langmuir* 2012, 28, 4672-4682.

First, GaN substrates are cleaved into 1 $cm^2$ pieces, and the pieces are cleaned by rinsing sequentially in $H_2O$, methanol, acetone, methanol, and $H_2O$. The GaN samples are etched and hydrogen terminated in concentrated hydrochloric acid for 5 min at room temperature. After etching, the wafers are rinsed with water, dried under a stream of $N_2$ (g), and placed in a $N_2$-purged flush box with <10 ppm of $O_2$ (g).

Next, H-terminated GaN samples are chlorinated for 45 min at 90° C. in a saturated solution of $PCl_5$ (99.998% Alfa Aesar) in anhydrous chlorobenzene (Aldrich) containing a few grains of the radical initiator benzoyl peroxide. The reaction is allowed to cool for 5-10 min, the solvent is drained, and the wafer is rinsed in chlorobenzene, followed by a rinse with anhydrous tetrahydrofuran (THF) (Aldrich).

Cl-terminated wafers are alkylated by immersion in 0.5 M ethynylmagnesium chloride solution in THF at 50-60° C. for >3 h. After alkylation, the GaN wafers are rinsed thoroughly with THF, submerged in THF and removed from the flush box. The wafers are then sonicated sequentially in THF, methanol and water for 10 min each, followed by rinsing with $H_2O$ and drying under a stream of $N_2$ (g).

Example 3

CdSe/CdS QDs Covalently Bonded to n-Doped GaN

A GaN substrate covalently attached to CdSe/CdS QDs suitable for use in some embodiments of devices and methods described herein can be prepared in a variety of ways, including the following. Although the following protocol describes the formation of a surface of n-doped GaN attached to CdSe/CdS QDs via an alkyne-azide click chemistry reaction, it is to be understood that other inorganic semiconductor surfaces may be functionalized with other QDs in analogous ways.

First, azide-functionalized CdSe/CdS QDs are prepared according to Example 1, and an alkyne-functionalized n-doped GaN substrate is prepared according to Example 2. Next, the QDs are added to the GaN surface in the presence of a Cu(I) catalyst.

Example 4

Green-Emitting Light Emitting Device

A light emitting device according to one embodiment described herein is fabricated as follows.

First, Group III-V semiconductor films (such as GaN films) are grown by two-flow metalorganic chemical vapor deposition (MOCVD). Growth is conducted at atmospheric pressure. Sapphire (two-inch diameter) having (0001) orientation is used as a substrate for the growth. The grown layers include a GaN buffer layer (approximately 300 Å thick, grown at 550° C.) and an n-type GaN:Si layer (approximately 4 µm thick).

The foregoing n-type GaN substrate is then functionalized with an alkyne moiety as described in Example 2 above. Next, azide-functionalized CdSe/CdS QDs (with an emission maximum between 525 nm and 530 nm) are prepared as described in Example 1 above and attached to the functionalized GaN substrate as described in Example 3 above.

Following the formation of the layer of QDs attached to the GaN substrate, a p-type hole-transporting polymer (e.g., PEDOT:PSS) is solution cast onto the layer of QDs. After formation of the p-type polymer overlayer, a Ni/Au contact is evaporated onto the polymer overlayer.

The wafer is then cut into rectangular chips (approximately 350 µm×350 µm). The chips are set on a lead frame and molded.

Various embodiments of the invention have been described in fulfillment of the various objects of the invention. It should be recognized that these embodiments are merely illustrative of the principles of the present invention. Numerous modifications and adaptations thereof will be readily apparent to those skilled in the art without departing from the spirit and scope of the invention.

The invention claimed is:

1. A light emitting device comprising:
   a first electrode;
   an inorganic semiconductor substrate formed from an inorganic semiconductor having a bandgap of greater than 2 eV;
   a layer of quantum dots, wherein the quantum dots are covalently bonded to the inorganic semiconductor substrate through one or more linkers having a first end covalently bonded directly to a surface of the inorganic semiconductor substrate and a second end bonded to a quantum dot; and
   an overlayer positioned between the first electrode and the layer of quantum dots.

2. The device of claim 1, wherein the inorganic semiconductor substrate is formed from GaN.

3. The device of claim 1, wherein the inorganic semiconductor substrate is an n-type layer.

4. The device of claim 1, wherein the layer of quantum dots is a close-packed layer of quantum dots.

5. The device of claim 1, wherein the quantum dots are formed from a Group II-VI semiconductor material.

6. The device of claim 1, wherein the quantum dots are formed from a Group III-V semiconductor material.

7. The device of claim 1, wherein the quantum dots comprise core-shell quantum dots.

8. The device of claim 1, wherein the quantum dots emit electromagnetic radiation having a peak emission between 525 and 535 nm.

9. The device of claim 1, wherein the quantum dots emit electromagnetic radiation having a peak emission between 580 and 590 nm.

10. The device of claim 1, wherein the one or more linkers comprise the reaction product of a click chemistry reaction.

11. The device of claim 1, wherein the one or more linkers comprise one or more conjugated moieties.

12. The device of claim 1, wherein the one or more linkers are non-conjugated.

13. The device of claim 1, wherein the overlayer is formed from a hole-transport material or an electron-transport material.

14. The device of claim 13, wherein the overlayer is formed from a polymeric material or a metal-containing material.

15. The device of claim 13, wherein the overlayer is formed from poly(3,4-ethylenedioxythiophene):polystyrene sulfonate (PEDOT:PSS), oxidatively doped polyaniline (PAni), oxidatively doped polypyrrole (Pyr), oxidatively doped polythiophene (PT), 2,2',7,7'-Tetrakis-(N,N-di-4-methoxyphenylamino)-9,9'-spirobifluorene (spiro-OMETAD), polytriarylamine, poly(2-vinylnapthalene), poly(9-vinylcarbazole), poly(2-vinylcarbazole), or a combination thereof.

16. The device of claim 13, wherein the overlayer is formed from $MoO_3$, NiO, copper (I) thiocyanate, copper (I) iodide, indium tin oxide (ITO), or a combination thereof.

17. The device of claim 1, wherein the overlayer is a p-type layer.

18. The device of claim 1, wherein the overlayer is immediately adjacent to and in contact with the quantum dot layer.

19. The device of claim 1, wherein the first electrode is in electrical communication with the overlayer.

20. The device of claim 1 further comprising a second electrode in electrical communication with the inorganic semiconductor substrate.

21. The device of claim 20, wherein the inorganic semiconductor substrate, the layer of quantum dots, and the overlayer are positioned between the first electrode and the second electrode.

22. The device of claim 1, wherein the device is a green-emitting light emitting diode.

23. The device of claim 1, wherein the device is an amber-emitting light emitting diode.

24. The device of claim 1, wherein the bandgap is between 2.5 eV and 4 eV.

25. The device of claim 1, wherein the one or more linkers have an individual length of 0.5 nm to 10 nm.

26. The device of claim 1, wherein the one or more linkers are non-Ohmic.

27. The device of claim 1, wherein the one or more linkers comprise $C_1$-$C_{50}$ aliphatic compounds.

* * * * *